United States Patent [19]

Messina et al.

[11] Patent Number: 5,239,200
[45] Date of Patent: Aug. 24, 1993

[54] APPARATUS FOR COOLING INTEGRATED CIRCUIT CHIPS

[75] Inventors: Gaetano P. Messina, Hopewell Junction; Robert A. Brewster; Theodore J. Kara, both of Poughkeepsie; Seaho Song, Highland, all of N.Y.

[73] Assignee: International Business Machines Corporation, Armonk, N.Y.

[21] Appl. No.: 748,004

[22] Filed: Aug. 21, 1991

[51] Int. Cl.[5] .................. H01L 23/02; H01L 25/04
[52] U.S. Cl. ................... 257/714; 257/712; 257/713; 301/689; 301/699; 165/80.4; 165/104.33
[58] Field of Search ............... 357/81, 82; 361/382, 361/385; 165/80.4, 104.33; 257/712, 713, 714

[56] References Cited

U.S. PATENT DOCUMENTS

| | | | |
|---|---|---|---|
| 3,361,195 | 1/1968 | Meyerhoff et al. | 357/82 |
| 3,524,497 | 8/1970 | Chu et al. | 357/82 |
| 4,494,171 | 1/1985 | Bland et al. | 361/386 |
| 4,574,877 | 2/1986 | Klein | 165/104.33 |
| 4,758,926 | 7/1988 | Herrell et al. | 361/385 |
| 4,871,015 | 10/1989 | Foley et al. | 357/82 |
| 4,884,168 | 11/1989 | August et al. | 357/82 |
| 4,920,574 | 4/1990 | Yamamoto et al. | 361/385 |
| 4,962,444 | 10/1990 | Niggemann | 361/382 |
| 4,964,458 | 10/1990 | Flint et al. | 165/80.4 |
| 4,977,443 | 12/1990 | Kobayashi et al. | 357/82 |
| 5,005,640 | 4/1991 | Lapinski et al. | 357/82 |
| 5,016,090 | 5/1991 | Galyon et al. | 357/82 |
| 5,023,695 | 6/1991 | Umezawa et al. | 357/82 |

FOREIGN PATENT DOCUMENTS

| | | |
|---|---|---|
| 0194216 | 2/1985 | European Pat. Off. . |
| 56-150841 | 11/1981 | Japan . |
| 57-96557 | 6/1982 | Japan . |
| 57-103337 | 6/1982 | Japan . |
| 1112445 | 3/1982 | U.S.S.R. . |

OTHER PUBLICATIONS

IBM Technical Disclosure Bulletin, vol. 20, No. 10 (Mar. 1978).

*Primary Examiner*—Rolf Hille
*Assistant Examiner*—David Ostrowski
*Attorney, Agent, or Firm*—Peter W. Peterson; Aziz M. Ahsan

[57] ABSTRACT

An apparatus for cooling an array of integrated circuit chips mounted on a substrate comprises a thermally conductive cooling plate which has a plurality of integral, substantially parallel, closed-end channels. A cover which may be made of plastic is adapted to seal the periphery of the cooling member and is spaced from the channel-containing surface. The cover has a plurality of integral baffles extending toward the cooling member into and along the length of the channels. The baffles and the channels are spaced from each other to permit passage of a coolant between and through the channels in a flow direction normal to the channels. An inlet and outlet for the coolant are provided on opposite ends of the apparatus, and may be located in the cover. In an alternate embodiment, the cooling plate contains at least two sets of the channels, each set of channels receiving a separate flow of coolant, either in parallel or in series with each other.

22 Claims, 6 Drawing Sheets

APPARATUS FOR COOLING INTEGRATED CIRCUIT CHIPS

BACKGROUND OF THE INVENTION

This invention relates to an apparatus for cooling integrated circuit chips and, in particular, to a liquid cooled plate which could contact the upper surface of a chip to directly remove heat.

Integrated circuit chips mounted in an array on substrates present special cooling difficulties. Although chip size has decreased and power usage is more efficient than in the past, the practice of mounting multiple, closely spaced chips on substrates has required that more emphasis be placed on cooling systems to remove the relatively high density power dissipated by the chips. Liquid coolants are commonly employed in such high density applications.

Various system have been disclosed in the prior art for providing a separate cooling member. Some of these utilize bellows-type liquid cool structures as exemplified by U.S. Pat. No. 4,977,443. However, such types of systems suffer in that they generally do not provide the large surface area required for high heat transfer rates. Other systems have attempted to utilize fins, channels or other structures in order to increase heat transfer area. U.S. Pat. No. 3,524,497 is one example which utilizes studs mounted in a liquid cooled structure for semiconductors. Another system, which utilizes microchannels, is exemplified by U.S. Pat. No. 4,758,926. A recent system disclosed in U.S. Pat. No. 4,964,458 to Flint et al., assigned to the assignee of the instant invention, uses a flexible sheet having a thermally conductive fin assembly extending normally from the sheet. The coolant flow in this fin type cooling system, as in other fin type systems, is in the same direction as the fins.

Japanese patent publication No. 57-96557 discloses another system which utilizes a series of baffle plates in an attempt to improve the efficiency of cooling by lengthening the flowing distance of the cooling medium. While this approach has some merit, the design is quite complex and expensive to fabricate. Other problems with prior art systems have been high pressure drop in the cooling medium utilized, and lack of uniformity of heat removal.

Bearing in mind the problems and deficiencies in the prior art, it is therefore an object of the present invention to provide a high performance cooling apparatus for integrated circuit chips mounted on a substrate.

It is another object of the present invention to provide an integrated chip cooling apparatus which provides uniformly high rates of heat removal.

It is still another object of the present invention to provide a cooling apparatus which is in close contact with the integrated circuit chips to remove heat therefrom.

It is a further object of the present invention to provide an efficient cooling apparatus for integrated circuit chips in which the coolant does not undergo high pressure drop.

It is yet another object of the present invention to provide a cooling apparatus which is in the form of a plate which may be placed over an integrated circuit chip heat transfer module.

It is a further object of the present invention to provide a cooling apparatus which meets the above objects and which is relatively inexpensive and easy to manufacture.

SUMMARY OF THE INVENTION

The above and other objects, which will be apparent to those skilled in the art, are achieved in the present invention which comprises an apparatus for cooling at least one integrated circuit chip. The apparatus may be placed in cooling relationship over a heat transfer module, or, alternatively, directly over an array of integrated circuit chips mounted on a substrate. The apparatus comprises a cooling member or plate which has a plurality of substantially parallel, closed-end channels. A cover is adapted to seal the periphery of the cooling member and is spaced from the channelcontaining surface. The cover has a plurality of baffles extending toward the cooling member into and along the length of the channels. The baffles and the channels are spaced from each other to permit passage of a coolant between and through the channels in a flow direction normal to the axis of the channels. The effect of the structure is to cause the coolant to impinge on channel surfaces to achieve high local heat transfer rates by reducing the thickness of the coolant boundary layer.

The cover and baffles are preferably integral and may be made of a non-electrically conductive material, such as plastic. The channels are also preferably integral with the cooling plate. At least one inlet and at least one outlet for the coolant are provided preferably on opposite ends of the apparatus, and may be located in the cover.

In its preferred embodiment, the cooling plate is of rectangular shape and the channels are straight and parallel to an end of the member.

In an alternate embodiment, the cooling plate contains at least two sets of the channels, each set of channels receiving a separate flow of coolant, either in parallel or in series with each other.

DETAILED DESCRIPTION OF THE INVENTION

Preferred embodiments of the present invention are depicted in FIGS. 1-6 in which like numerals refer to like features of the invention. Such features are not necessarily shown to scale in the drawings.

The apparatus of the present invention provides a high performance cooling plate for use in cooling modules containing a plurality of integrated circuit chips. A typical substrate 12 is depicted in side view in FIG. 1 as having a plurality of integrated circuit chips 16 mounted in an array, such as a 10×10 array above a single or multiple layer substrate 12. The chips 16 are electrically connected to the substrate 12 by a plurality of connections 14 such as solder balls, in a method known as "flip chip" packaging. The lower surface of substrate 12 may contain connectors (not shown) for connection of the substrate 12 to another electronic device such as a circuit board.

Figure 1:
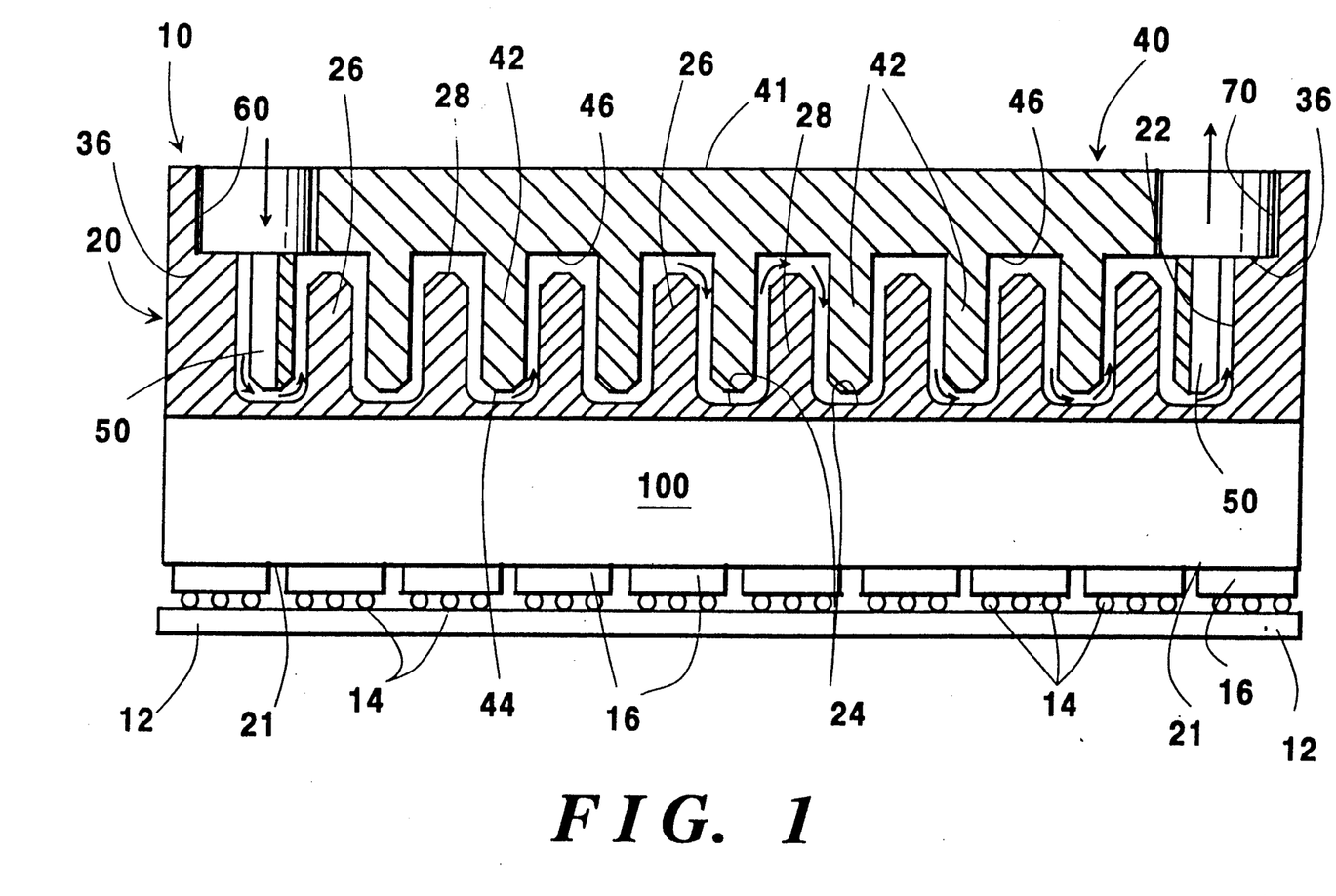
FIG. 1 is a schematic side elevational view, taken along section 1—1 in FIG. 2, showing the preferred cooling apparatus of the present invention in cross section, disposed over a heat transfer module.
Figure 2:
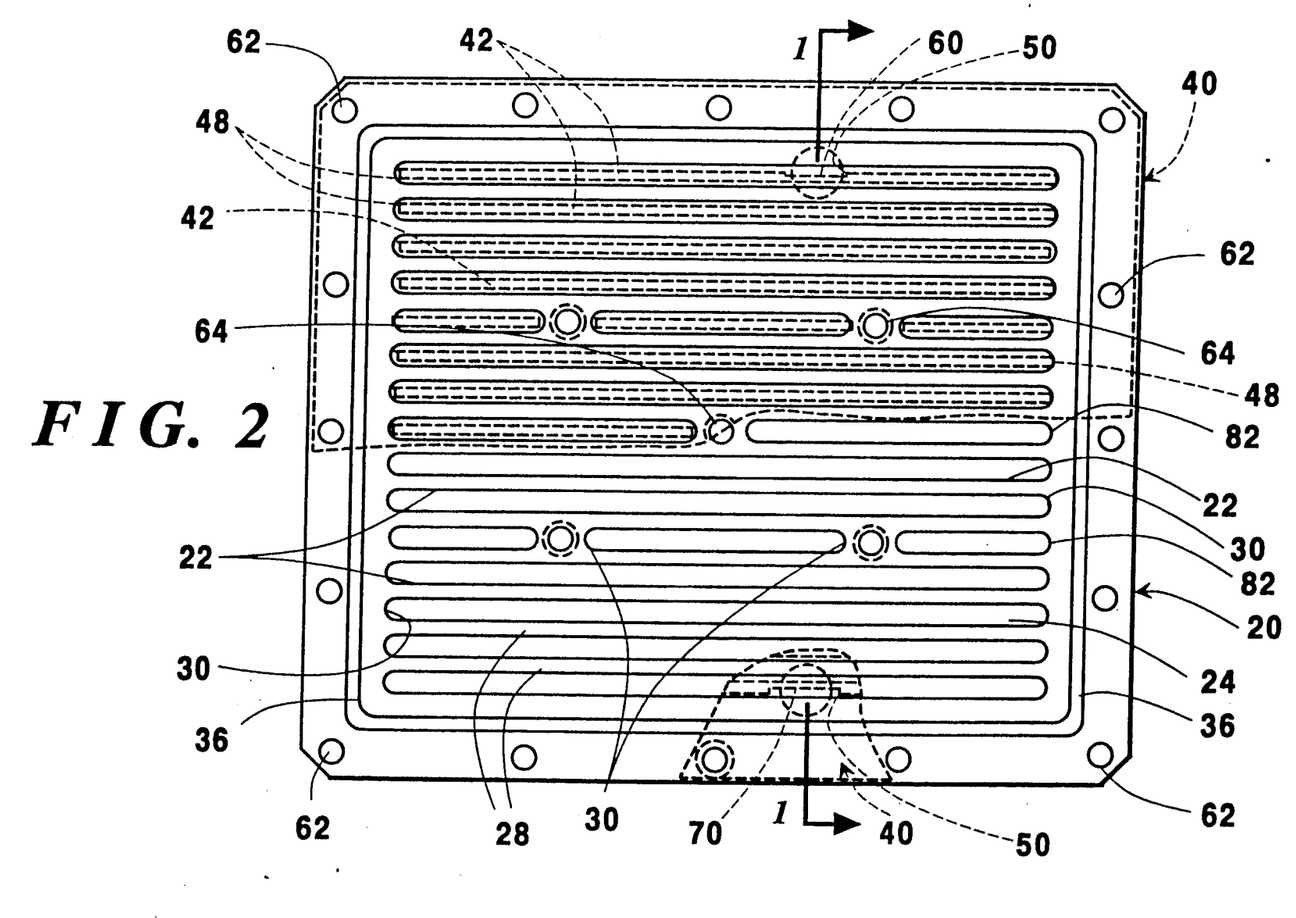
FIG. 2 is a top plan view of the cooling apparatus depicted in FIG. 1, showing the cover member partially cut away and in phantom lines.

Disposed in a cooling relationship over the array of chips 16 is a heat transfer module 100, such as that disclosed in U.S. patent Ser. No. 198,962, the disclosure of which is hereby incorporated by reference. A normal flow cold plate apparatus 10 made in accordance with the present invention is disposed in a cooling relationship over heat transfer module 100. The apparatus as shown in FIGS. 1 and 2 comprises cooling member or plate 20 which is generally of a rectangular shape as seen in plan view to conform to the shape of the integrated circuit chip substrate 12 or module 100. Cooling plate 20 is preferably made from aluminum, copper or some other high thermal conductivity metal or material which efficiently conducts the heat away from chips 16.

Cooling plate 20 has integrally formed therein a plurality of open, straight channels 22 which are each parallel to an end of plate 20. These channels 22 are essentially formed between wall segments 26. The wall segments 26 have an upper surface 28, and channels 22 may be machined or molded out of a flat cooling plate. Channels 22 receive a coolant, preferably a liquid such as water, to remove the heat conducted away from the integrated circuit chips. The channels 22 generally extend across the full width of the plate and have closed ends 30. Several separate, shorter closed end channel segments 82 extending across the width of the plate are provided in line with the interior fastener openings 64 or 65.

To provide a sealed enclosure for the coolant, an overhead cover member 40 is disposed over cooling plate 20 in sealing relationship with the periphery 36 of cooling plate 20. Within its periphery, the underside 46 of cover 40 is spaced away from the cooling plate surface 28 to ensure that coolant may flow from one channel 22 to an adjacent channel over the surface 28 of wall segments 26 formed between the channels. Integral plate-type baffles 42 extend downwardly from the underside of cover 40 into the channels 22 along their axes. Baffle ends 48 contact channel ends 30. As seen in the side view in FIG. 1, space exists between baffle 42 and wall segment 26, creating channel 22. A similar space for channel 22 also exists between baffle lower end 44 and channel bottom 24 so as to direct and permit passage of coolant between and through the channels in the direction shown by the arrows in a general flow direction normal to the axis of the channels. Baffles 42 extend along the full length of channels 22 so that substantially all of the channel bottom 24 areas receive an "impinging" coolant flow which results in very high local heat transfer coefficient on the lower part of cooling plate 20. The flow path of the coolant normal to the direction of the channels is constantly changed by the walls of the baffles 42 and wall segments 26. This causes constant turning and impingement of the coolant on the surfaces formed by channels 22 which enhances the local heat transfer by creating eddy currents and reducing the thickness of the fluid boundary layer.

An inlet 60 and outlet 70 are provided through cover surface 41 on opposite ends of the cover intermediate the corners to permit entry and exit, respectively, of the coolant fluid. Of course, the apparatus of the present invention could have more than one cooling fluid inlets and outlets, and a person skilled in the art could place the fluid inlets and outlets at the desired locations. The baffles 42 adjacent to inlet 60 and outlet 70 can have partially cut away portions 50 in order to permit free flow of the coolant into and out of the channels on either ends of cover member 40.

Because of the unique, two (2) piece construction of the preferred embodiment of the present invention, the parts may be easily bolted or otherwise fastened to each other through interior fastener openings 64 and 65 in cooling plate 20 and cover 40, respectively. Peripheral fastener openings 62 in cooling plate 20 permit the apparatus to be secured to other supporting structures and/or components. Additionally, because heat is transferred only into the underside of cooling plate 20, and because the primary purpose of baffles 42 in cover 40 are to direct the flow of coolant, cover 40 and integral baffles 42 may be made of a non-electrically conductive material of low thermal conductivity, such as plastic. This enables relatively easy and inexpensive manufacturing techniques to be used, for example, injection molding. The configuration of cooling plate 20 also lends itself to the use of easy-to-manufacture powder metals in which channels 22 may be directly formed in the powder metal mold.

Figure 3:
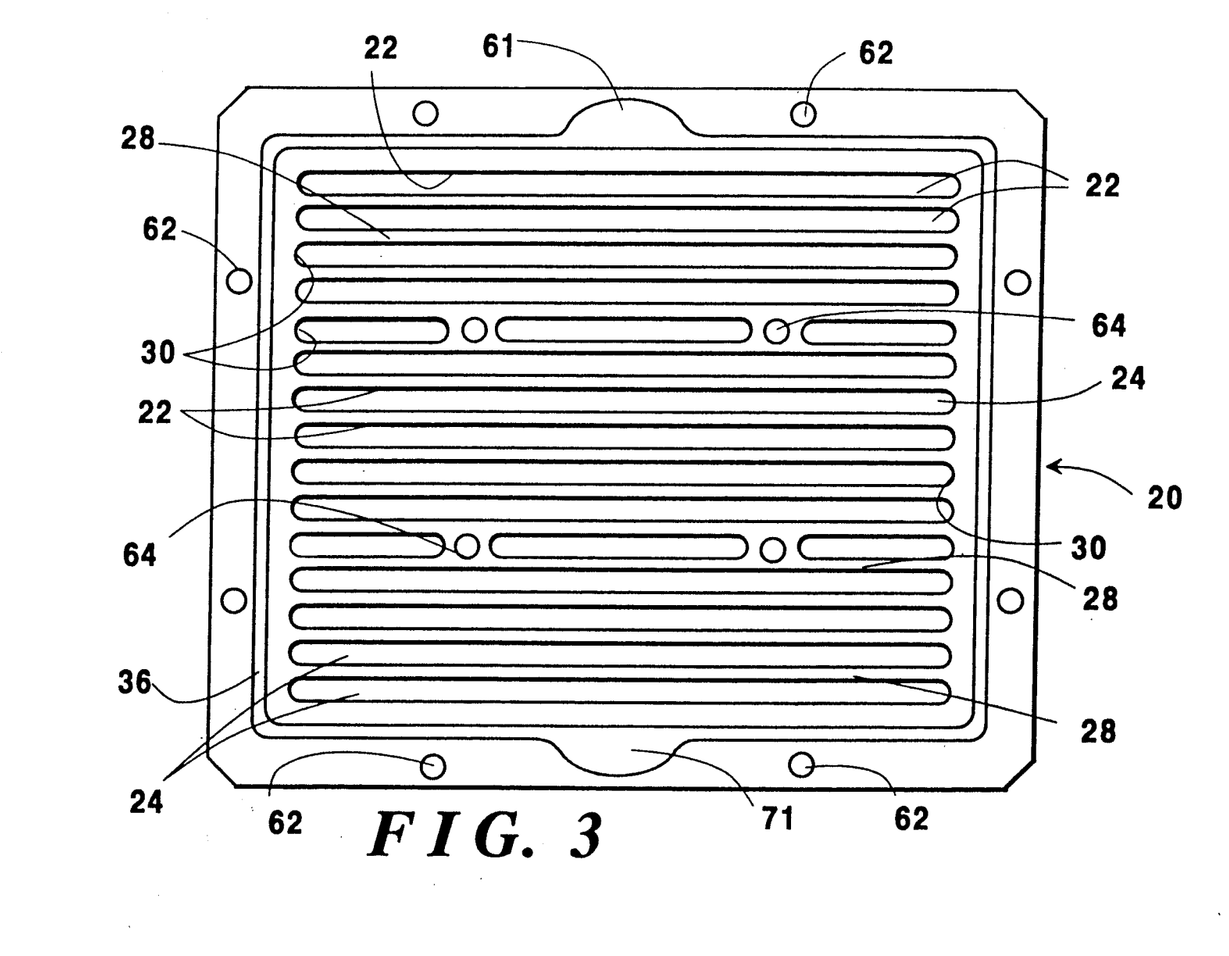
FIG. 3 is a top plan view of an alternate embodiment of an integrated circuit chip cooling plate made in accordance with the present invention.
Figure 4:
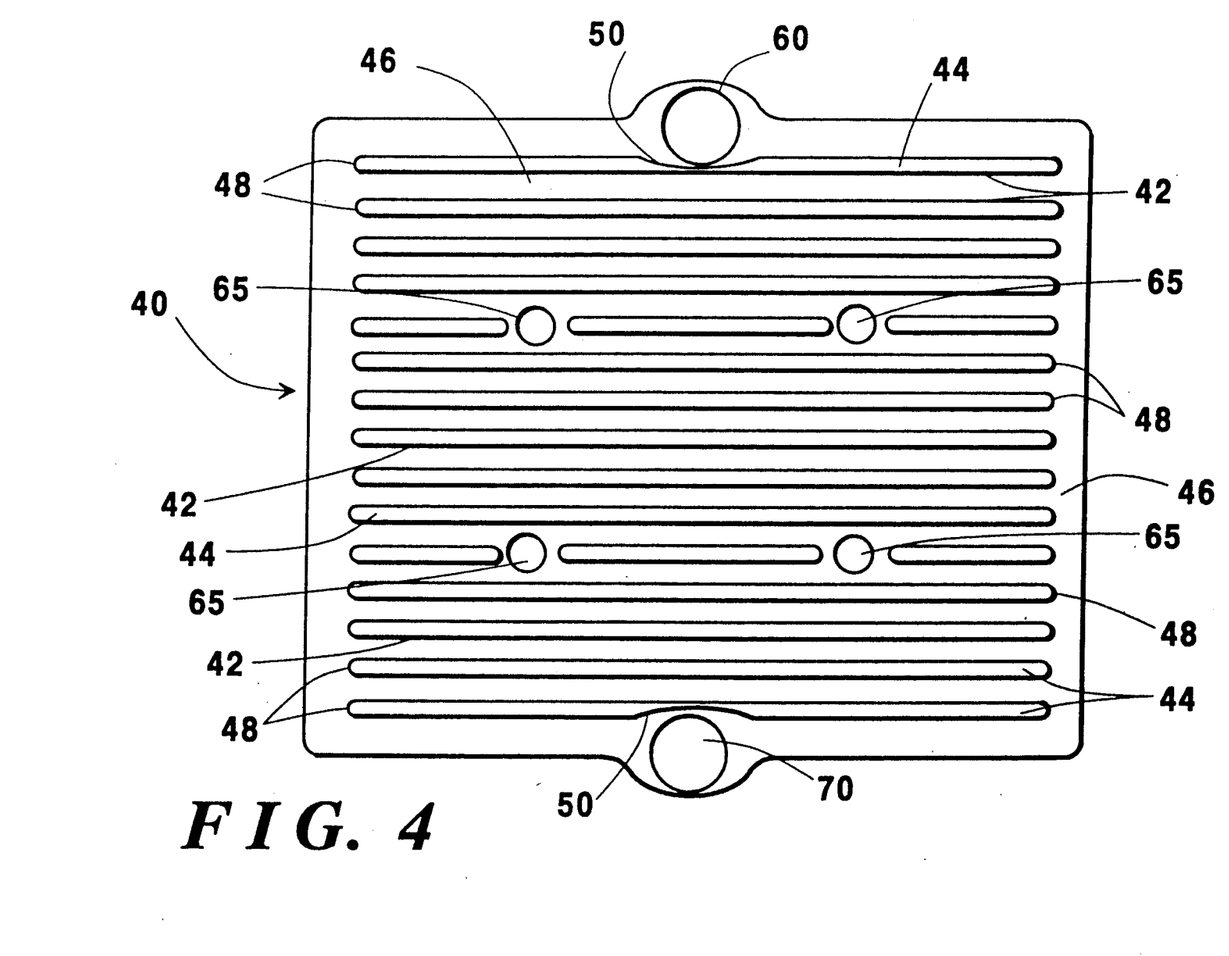
FIG. 4 shows the underside of the cover for the cooling plate depicted in FIG. 3.

Another embodiment of the present invention is depicted in FIGS. 3 and 4. In FIG. 3 there is depicted the lower cooling plate 20 having thereon a series of straight channels 22 parallel to one edge thereof. In this embodiment, inlet 61 and outlet 71 cavities are provided on opposite ends of the cooling plate surface to distribute coolant to and from adjacent channels. Of course, at either end one could have one or more inlet 61 or outlet 71. The cover member 40 is depicted in FIG. 4 which shows its underside and baffles 42 which correspond to each and every channel 22 on the cooling plate. These baffles 42 extend the full width of the channels, to the channel end walls, 30, to ensure that the substantially all of the coolant impinges on the channel walls in a direction normal to the axis of the channels. Inlet 60 and outlet 70 openings are provided in cover 40 which correspond respectively to inlet 61 and outlet 71 portions of cooling plate 20 so as to permit passage of coolant into and out of the apparatus. The outlet openings in the embodiment shown in FIGS. 3 and 4 are located midway along opposite sides of the apparatus, although other locations may be utilized.

Figure 5:
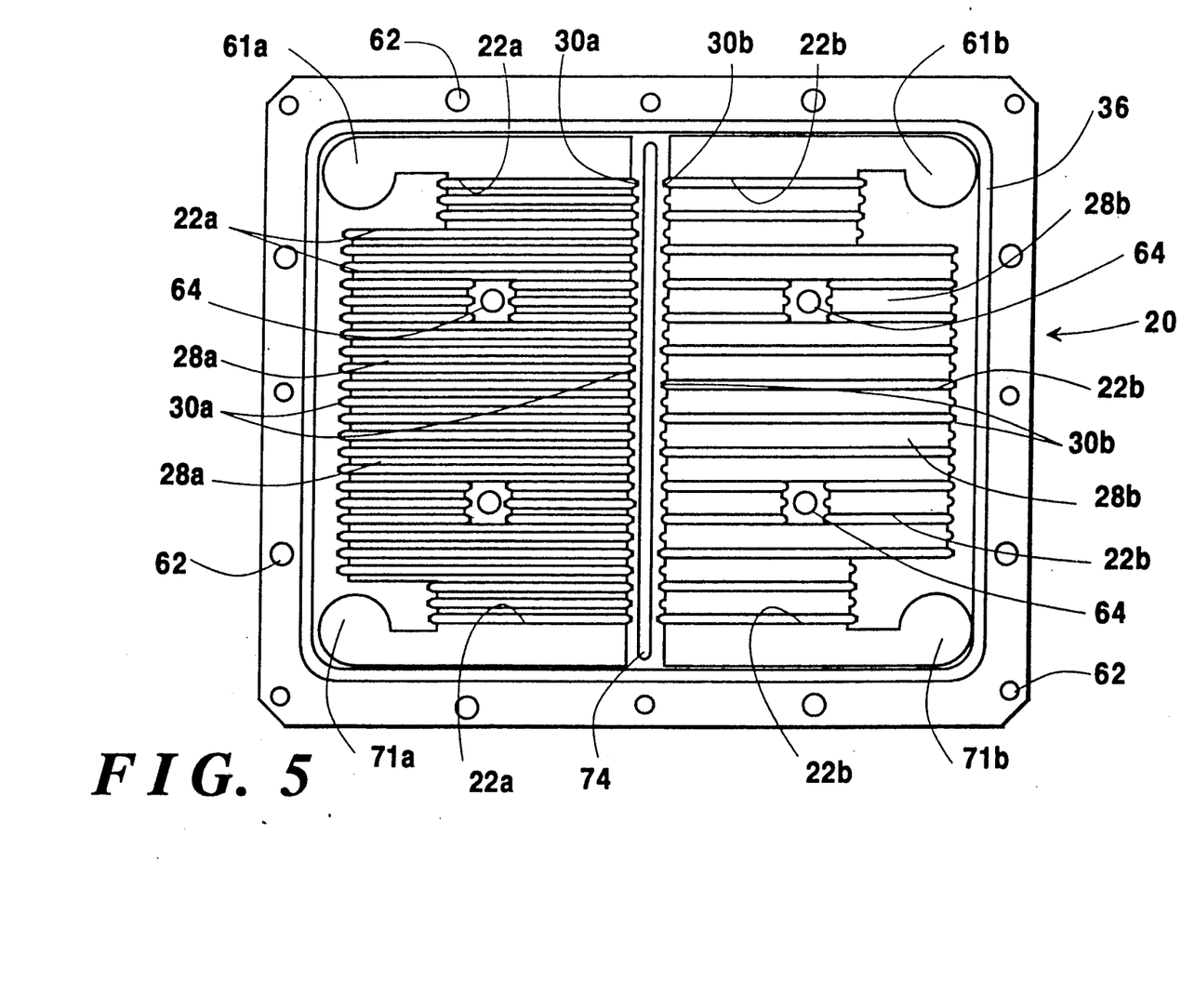
FIG. 5 is a top plan view of another embodiment of a cooling plate made in accordance with the present invention, in which the plate contains two (2) different sets of channels, each set of channels receiving a separate flow of coolant.

Another preferred embodiment of the invention is depicted in FIG. 5 in which more than one set of channels is provided to receive separate flows of coolant. In the particular embodiment shown, one set of parallel straight channels 22a are shown in the upper surface along the left side of cooling plate 20. A second, separate set of channels 22b having wider walls between the channels are formed along the right side of cooling plate 20. The particular features are numbered in the same manner as described in previous embodiments, except that the suffix "a" is used for features on the left-hand segment and the suffix "b" is used for features on the right-hand segment. A wall 74 is provided between the two cooling plate channel segments to seal the segments from each other. The greater amount of heat transfer surface in the closer spaced channels 22a provides increased heat extraction to that portion of the plate to accommodate chips having higher density power dissipation in that portion of substrate 12 or heat transfer module 100. The heat transfer rate (for equal water flow) will be lower on the right hand side of cooling plate 20. The cover for the type of cooling plate depicted in FIG. 5 should have corresponding baffles for the channels, with the baffles extending along the full length of each channel. The cover should also seal along wall 74 to separate the channel segments.

In the embodiment shown in FIG. 5, the inlets and outlets are provided at opposite corners of the apparatus, although one or more other locations may be utilized if desired. The cooling plate inlet and outlet portions 61a, 61b, and 71a, 71b, respectively, include shallow openings which lead across the full width of the adjacent channels to provide better coolant distribution.

The segmentation of groups of channels on the cooling plate surface may be adapted to any type of cooling arrangement required for the integrated circuit chips modules. So that a separate set or group of channels may be provided in any particular area with a desired cooling rate (depending on the chip configuration on the module), even three or more sets of channels having different separate inlets 61a, 61b and outlets 71a, 71b may be arranged so that the coolant flow from the external source of coolant (not shown) flows in parallel or in series between the sets of channels.

Figure 6:
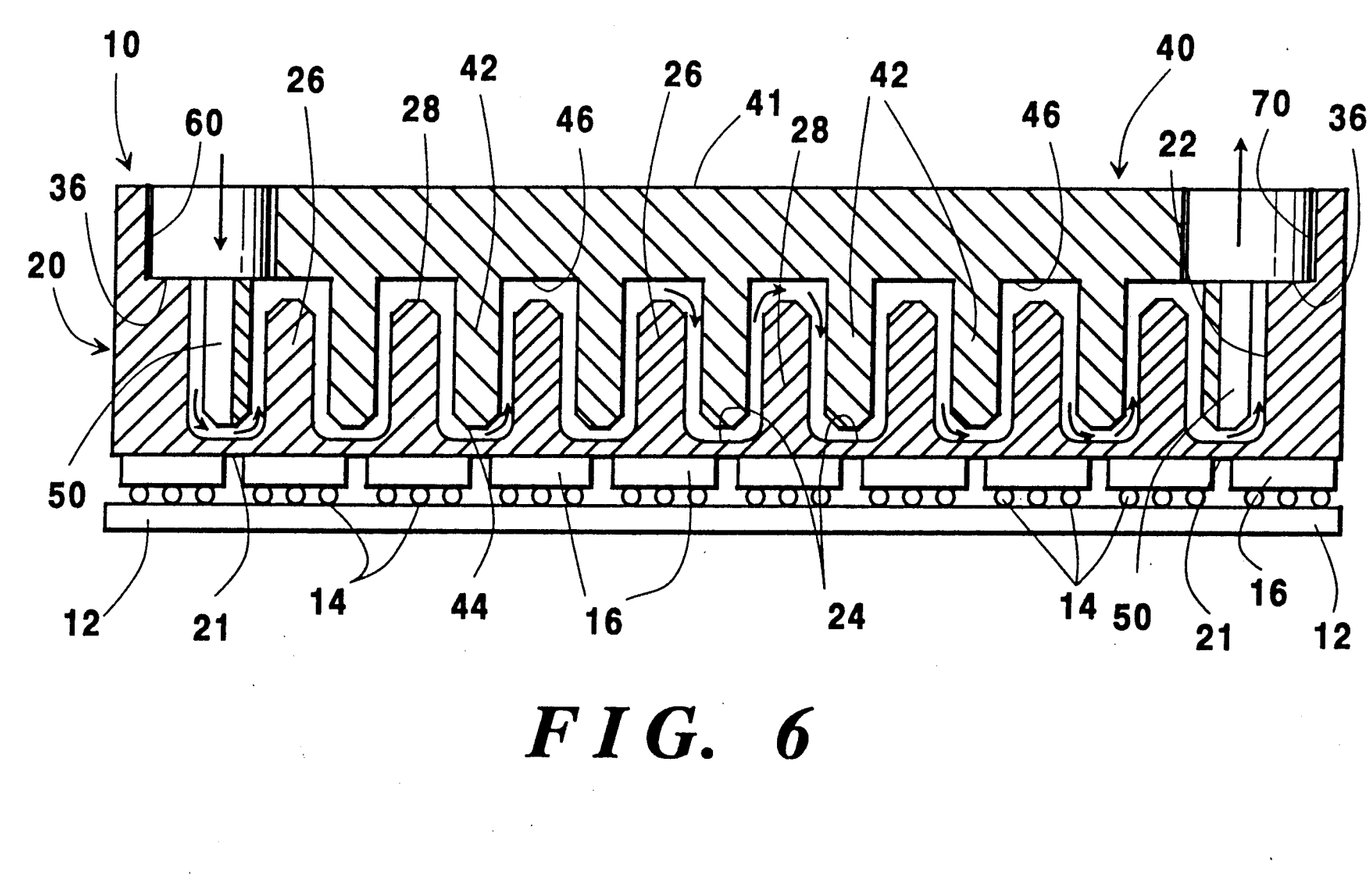
FIG. 6 illustrates the cooling apparatus of FIG. 1 in close contact with a plurality of integrated circuit chips mounted on a substrate.

Instead of utilizing a heat transfer module 100 as shown in FIG. 1, the cooling apparatus of the present invention 10 may be placed in direct cooling relationship with the substrate-mounted chips. As shown in FIG. 6, the underside 21 of the cooling plate 20 directly contacts the top surfaces of the integrated circuit chips 16. This cooling plate lower surface is essentially planar and conforms to the top surfaces of the chips 16, although minor variations in height and/or angle of the chips may be accommodated in the normal manner, for example, by an intermediate thermally conductive grease.

Thus, the present invention provides an improved cooling apparatus for arrays of integrated circuit chips mounted on a substrate by providing constant impingement of coolant on channels walls. These channels may be configured to accommodate the particular cooling requirements of an integrated circuit chip substrate or heat transfer module. The present invention can therefore provide particularly uniform cooling of typical substrates or heat transfer modules.

The unit in its most basic two piece form comprising the cooling plate and cover is particularly easy to manufacture, install and service. The fact that the upper cover plate is designed so as not to directly contact the conductive heat transfer points permits it to be made of a less expensive, non-electrically conductive, low thermally conductive material such as plastic by relatively inexpensive manufacturing techniques such as injection molding. Likewise, the simple configuration of the lower cooling plate, which should be made of a high thermally conductive material, can be accommodate by simply machining or forming techniques, the latter being exemplified by powder metal forming technology.

While this invention has been described with reference to specific embodiments, it will be recognized by those skilled in the art that variations are possible without departing from the spirit and scope of the invention, and that it is intended to cover all changes and modifications of the invention disclosed herein for the purposes of illustration which do not constitute departure from the spirit and scope of the invention.

Having thus described the invention, what is claimed is:

1. An apparatus for cooling at least one integrated circuit chip comprising:
   a cooling member having a plurality of substantially parallel, closed-end, closed-bottom channels extending along an axis on, and open to, a surface of the cooling member; and
   a cover adapted to seal the periphery of said cooling member and spaced from the channel-containing surface, said cover having a plurality of baffles projecting toward the cooling member and extending into and along the length of said channels below the channel-containing surface of said cooling member, said baffles and said channels being spaced from each other to permit passage of a coolant between and through said channels in a flow direction normal to said channels, said baffles being adapted to direct said coolant in an impinging flow against the bottom of said channels.

2. The apparatus of claim 1 wherein said baffles are made of a non-electrically conductive material.

3. The apparatus of claim 1 wherein said channels and baffles are integral with said cooling member and cover, respectively.

4. The apparatus of claim 1 wherein said cooling member contacts at least a portion of a heat transfer module.

5. The apparatus of claim 1 further including at least one inlet and at least one outlet for said coolant.

6. The apparatus of claim 5 wherein said at least one inlet and said at least one outlet are located in said cover.

7. The apparatus of claim 1 wherein said cooling member is a plate of rectangular shape and said channels are parallel to an end of said member, and further including a coolant inlet and outlet located on opposite ends of the assembled cover and cooling member.

8. The apparatus of claim 1 wherein said cooling member is adapted to contact the upper surface of at least one integrated circuit chip mounted on a substrate.

9. The apparatus of claim 1 wherein said cooling member is adapted to contact the upper surface of at least one integrated circuit chip mounted on a substrate, and wherein said cooling member contains at least two sets of said channels, each set of channels receiving a separate flow of coolant.

10. An apparatus for cooling a plurality of integrated circuit chips comprising:
    a cooling plate having a plurality of integral, substantially parallel, closed-end, closed-bottom channels extending along an axis, on and open to, a surface of the cooling member; and
    a cover adapted to seal the periphery of said cooling plate and spaced from the channel-containing surface, said cover having a plurality of integral baffles projecting toward the cooling plate and extending into and along the length of said channels below the channel-containing surface of said cooling member, said baffles and said channels being spaced from each other to permit passage of a coolant between and through said channels in a flow direction normal to said channels, said baffles being adapted to direct said coolant in an impinging flow against the bottom of said channels.

11. The apparatus of claim 10 wherein said baffles are made of a non-electrically conductive material.

12. The apparatus of claim 10 wherein said cooling member contacts at least a portion of a heat transfer module.

13. The apparatus of claim 10 wherein said cooling member contacts at least a portion of at least one integrated circuit chip.

14. The apparatus of claim 10 further including at least one inlet and at least one outlet for said coolant.

15. The apparatus of claim 10 wherein said cooling plate is of rectangular shape and said channels are parallel to an end of said plate, and further including at least one coolant inlet and outlet located on opposite ends of the assembled cover and cooling plate.

16. The apparatus of claim 10 wherein said cooling plate contains at least two sets of said channels, each set of channels receiving a separate flow of coolant.

17. An apparatus for cooling a plurality of integrated circuit chips mounted on a substrate comprising:
a cooling plate made of a thermally conductive material, said plate having a plurality of integral, substantially parallel, closed-end, closed-bottom channels extending along an axis on, and open to, a surface of the cooling member; and
a cover adapted to seal the periphery of said cooling plate and spaced from the channel-containing surface, said cover having a plurality of integral baffles projecting toward the cooling plate and extending into and along the complete length of said channels below the channel-containing surface of said cooling member, said baffles and said channels being spaced from each other to permit passage of a coolant between and through said channels in a flow direction normal to the axis of said channels, said baffles being adapted to direct said coolant in an impinging flow against the bottom of said channels.

18. The apparatus of claim 17 wherein said cooling member contacts at least a portion of a heat transfer module.

19. The apparatus of claim 17 wherein said cooling member contacts at least a portion of at least one integrated circuit chip.

20. The apparatus of claim 17 wherein sad baffles are made of a non-electrically conductive material.

21. The apparatus of claim 17 wherein said cooling plate is of rectangular shape and said channels are parallel to an end of said plate, and further including at least one coolant inlet and outlet located on opposite ends of the assembled cover and cooling plate.

22. The apparatus of claim 17 wherein said cooling plate contains at least two sets of said channels, each set of channels receiving a separate flow of coolant.

* * * * *